United States Patent [19]

Gaicki

[11] 4,285,003
[45] Aug. 18, 1981

[54] LOWER COST SEMICONDUCTOR PACKAGE WITH GOOD THERMAL PROPERTIES

[75] Inventor: Stanley Gaicki, Tempe, Ariz.

[73] Assignee: Motorola, Inc., Schaumburg, Ill.

[21] Appl. No.: 21,865

[22] Filed: Mar. 19, 1979
(Under 37 CFR 1.47)

[51] Int. Cl.³ .................. H01L 23/02; H01L 23/12; H01L 23/48
[52] U.S. Cl. ...................................... 357/81; 357/74; 357/68
[58] Field of Search .................. 357/67, 74, 81, 68

[56] References Cited

U.S. PATENT DOCUMENTS

| | | | |
|---|---|---|---|
| 3,097,329 | 7/1963 | Siemens | 357/67 |
| 3,190,954 | 6/1965 | Pomerantz | 357/81 |
| 3,199,000 | 8/1965 | Nippert | 357/81 |
| 3,399,332 | 8/1968 | Savolainen | 357/81 |
| 3,434,018 | 3/1969 | Boczar et al. | 357/81 |
| 3,483,444 | 12/1969 | Parrish | 357/81 |
| 3,512,050 | 5/1970 | Burton et al. | 357/81 |
| 3,745,422 | 7/1973 | Carnes | 357/81 |
| 4,124,864 | 11/1978 | Greenberg | 357/81 |
| 4,196,444 | 4/1980 | Butner et al. | 357/74 |

Primary Examiner—Andrew J. James
Attorney, Agent, or Firm—Paul F. Wille

[57] ABSTRACT

An improved mounting base is disclosed in which a semiconductor die is mounted on a thin pedestal within a large counter bore in the mounting base or header of the transistor package.

8 Claims, 2 Drawing Figures

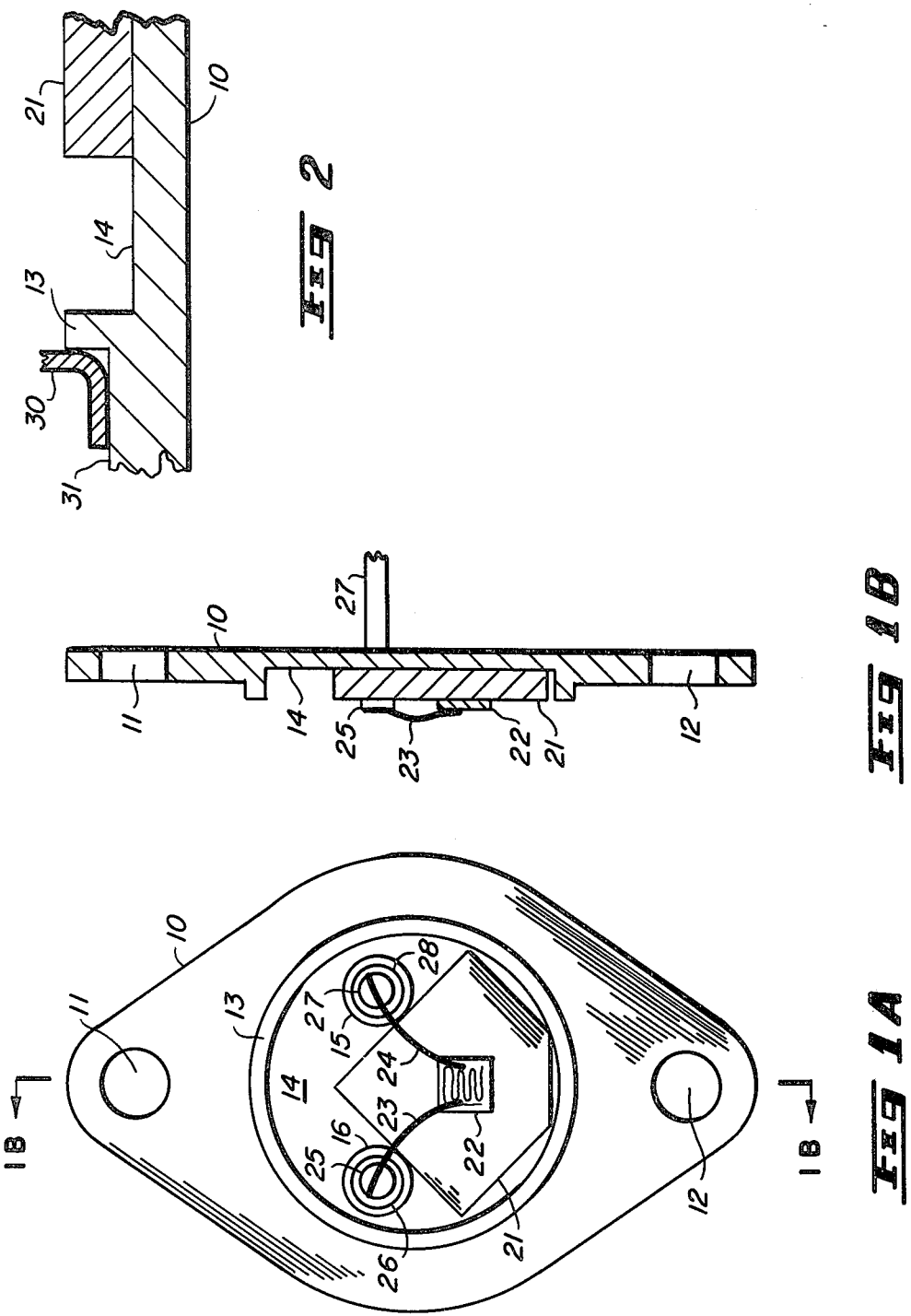

LOWER COST SEMICONDUCTOR PACKAGE WITH GOOD THERMAL PROPERTIES

BACKGROUND OF THE INVENTION

This invention relates to the package or case for transistors and, in particular, to an improved mounting base for transistors dissipating large amounts of power.

In the past, high power semiconductor devices have been characterized by obvious bulk, long thought necessary to remove the heat from the semiconductor chip or die. In general, the concept has been to provide a mass of material in good thermal contact with the die to remove the heat generated during operation of the device. In what is known as the TO-3 type case, the diamond shaped mounting base or header may comprise nickel plated steel or aluminum. Aluminum is used in premium or high power devices due to its superior thermal conductivity.

Aluminum is more costly than steel and is not as strong. The problem with steel is its lower thermal conductivity. In the past, demands for progressively higher power capability have resulted in aluminum being the material chosen for the header. The resulting device is typically a thick aluminum base having a thick copper pedestal to which the semiconductor die is attached, the combination acting as a heat sink for the device.

In view of the foregoing, it is therefore an object of the present invention to provide an improved mounting base for semiconductor devices.

Another object of the present invention is to provide a steel mounting base at least equal in thermal characteristics to aluminum mounting bases.

A further object of the present invention is to provide a mounting base having lower material requirements than those of the prior art.

Another object of the present invention is to provide a mounting base making more efficient use of materials than mounting bases of the prior art.

The foregoing objects are achieved in the present invention wherein a steel mounting base is provided with a central counterbore having a diameter slightly less than the outside dimension of the package. This provides a relatively thin mounting base area in which is welded or brazed a thin copper pedestal. The pedestal has a smaller area than the counterbore and a larger area than the semiconductor chip or die fastened thereon.

A more complete understanding of the present invention can be obtained by considering the following detailed description in conjunction with the accompanying drawings, in which:

FIG. 1a is a top view of a TO-3 header in accordance with the present invention.

FIG. 1b is a side view of a TO-3 header in accordance with the present invention.

FIG. 2 is a cross-section of a portion of a TO-3 package in accordance with the present invention.

DETAILED DESCRIPTION OF THE INVENTION

Referring to FIGS. 1a and 1b, a TO-3 header in accordance with the present invention comprises a steel mounting piece 10 having a generally diamond shape in which mounting holes 11 and 12 are formed along the long diagonal of the diamond. In the region of the mounting holes, and around the periphery of mounting base 10, mounting base 10 has a thickness typically of 50-60 mils (1.3-1.5 millimeters). Approximately centrally located within mounting base 10 is angular ring 13 surrounding counterbore 14. Counterbore 14 is typically 680 mils (17.3 millimeters) in diameter and 20-30 mils (0.5-0.8 millimeters) deep, resulting in a thickness of approximately 20-40 mils (0.5-1.0 millimeters) for the central area of the mounting base. Ring 13, which may conveniently comprise a portion of the material extruded to form counterbore 14, forms a retaining wall and splash ring, useful during the later attachment of the cap to the header.

Within counterbore 14 are located smaller rings 15 and 16 having bores therein for receiving leads 27 and 25 respectively. Electrically isolating leads 25 and 27 from the mounting base are suitable glass seals 26 and 28 respectively. Within counterbore 14 is placed a copper pedestal 21, which may be soldered, brazed or welded to mounting base 10. Pedestal 21 is preferably at least 15 mils (0.4 millimeters) thick to assure adequate mechanical stability. Pedestal 21 may comprise any suitable geometric shape, such as a square having one corner removed as illustrated in FIG. 1a. In this configuration, depending upon the size of the square chosen, pedestal 21 is self-locating within counterbore 14, thereby simplifying subsequent assembly steps. Mounted to pedestal 21 is a semiconductor chip or die 22, which is typically soldered to pedestal 21. Leads 23 and 24 interconnect the semiconductor die with pins 25 and 27 respectively.

FIG. 2 illustrates in cross-section a detail of a complete package in accordance with the present invention. Specifically, cap 30 has an inside diameter slightly in excess of the outside diameter of splash ring 13 such that the cap is self-aligning during assembly of the package. Cap 30 is welded to base 10 in region 30, underneath the lip portion of cap 30. Thus, splash ring 13 provides the second function of shielding the die from particles emitted during the welding of cap 30. Unlike prior art devices, splash ring 13 is preferably not used as a source of material for the actual welding.

In operation, heat generated in the die is conducted away by the thin copper pedestal and thin mounting base. It is believed that the improved thermal characteristics of devices in accordance with the present invention results from the shorter path to the outside world via the mounting base or from conduction to heavier portions of the mounting base. In either event, the use of thinner materials under the semiconductor die appears to improve the removal of heat whereas heavier materials tend to absorb the heat, trapping it near the die.

There is thus provided by the present invention an improved mounting base for power devices, which base has comparable thermal characteristics to present aluminum bases. Specifically, standard aluminum TO-3 packages for a particular die having a 125 mil (3.2 mm) thick base, 410 mil (10.4 mm) diameter by 62 mil (1.6 mm) thick pedestal exhibited on a $\theta JC$ (junction to case temperature difference) of 0.65°-0.72° C./watt (0.67 average), while TO-3 packages in accordance with the present invention for the same die exhibited a $\theta JC$ of from 0.64°-70° C./W (0.67 average). The headers in accordance with the present invention comprised a 406 mil (10.3 mm) square by 62 mil (1.6 mm) thick pedestal soldered to a 62 mil (1.6 mm) thick mounting base having a 20 mil (0.5 mm) deep counterbore.

Standard steel headers comprise a 62 mil (1.6 mm) thick mounting base having an 85 mil (2.2 mm) thick pedestal having an approximate diameter of 875 mils (22.2 mm). $\theta JC$ for standard steel headers is 0.79°–0.85° C./W, 0.82 average. Premium steel headers, having the same dimensions, exhibit a $\theta JC$ of 0.56°–0.63° C./W, 0.58 average. The premium steel headers are considerably more costly, however, because of extensive use of gold, e.g. as plating and in a gold eutectic to bond the pedestal to the mounting base.

Having thus described the invention it will be apparent to those of skill in the art that various modifications can be made within the spirit and scope of the present invention. For example, while a preferred embodiment has been described incorporating a square pedestal, any suitable shape may be used. Also, while a second ridge, outside the splash ring, is not illustrated, one could be used to provide material for the welding of the cap to mounting base 10. Also, while a preferred embodiment has been described in conjunction with a TO-3 type case, other case configurations may advantageously employ the present invention. Similarly, while illustrated as including a single semiconductor die, it is understood that a plurality of die or semiconductor devices may be incorporated within a single case in accordance with the present invention.

I claim:

1. In a case for semiconductor devices having a mounting base having at least one aperture through which a lead passes, a pedestal to which semiconductor die are attached, and a cap for enclosing said die, the improvement comprising:
a thinned region in said base for reducing the thickness of said base in a central area wherein said thinned region is greater than 5 mils (0.13 mm) thickness, said pedestal being 15–60 mils (0.38–1.5 mm) thick and smaller in area than said thinned region and being attached to said base in said central area.

2. The case as set forth in claim 1 wherein said mounting base comprises steel.

3. The case as set forth in claim 2 wherein said pedestal comprises copper.

4. The case as set forth in claims 1 or 2 or 3 and further comprising raised annular splash ring surrounding said thinned region.

5. The case as set forth in claim 4 wherein said cap has an inside diameter greater than the outside diameter of said raised annular splash ring.

6. The case as set forth in claims 1 or 2 or 3 wherein said at least one aperture for a lead is within said central area.

7. The case as set forth in claim 6 wherein each aperture for a lead is surrounded by a raised annular ring and said pedestal fits within said thinned region and the annular ring surrounding each aperture.

8. The case as set forth in claim 7 wherein said pedestal has an area less than half the area of said thinned region.

* * * * *